United States Patent [19]

Ulbrich et al.

[11] Patent Number: 4,649,341
[45] Date of Patent: Mar. 10, 1987

[54] INDUCTIVE MEASURING ARRANGEMENT FOR DETERMINING THE POSITION OF A MOVABLE CORE MEMBER

[75] Inventors: Gerald Ulbrich, Hanover; Detlev Neuhaus, Langenhagen, both of Fed. Rep. of Germany

[73] Assignee: WABCO Westinghouse Fahrzeugbremsen GmbH, Hanover, Fed. Rep. of Germany

[21] Appl. No.: 602,840

[22] Filed: Apr. 23, 1984

[30] Foreign Application Priority Data

Apr. 21, 1983 [DE] Fed. Rep. of Germany ....... 3314440
Dec. 5, 1983 [DE] Fed. Rep. of Germany ....... 3343885

[51] Int. Cl.$^4$ .................. G01B 7/14; G01R 27/26
[52] U.S. Cl. ...................... 324/207; 324/59
[58] Field of Search ............ 324/59, 60 CD, 207, 324/208, 111; 340/870.31, 870.32, 870.35, 870.36; 318/653, 656, 657

[56] References Cited

U.S. PATENT DOCUMENTS 2,937,369  5/1960  Newbold et al. ...... 324/60 CD UX
3,197,701  7/1965  Sangl et al. ........... 324/60 CD UX
3,886,447  5/1975  Tanaka ................. 324/60 CD
4,339,953  7/1982  Iwasaki ................ 324/208 X
4,384,251  5/1983  Schelling et al. ..... 324/207

FOREIGN PATENT DOCUMENTS 2126347  3/1984  United Kingdom ............... 324/207

Primary Examiner—Gerard R. Strecker
Attorney, Agent, or Firm—G. E. Hawranko

[57] ABSTRACT

An arrangement for determining the position of a core within a coil improves a voltage across the coil upon generation of an initiating voltage pulse. The initiating voltage pulse can originate from a microprocessor or other electrical timing logic circuit. The charging current in the coil is developed from this initiated time until either a predetermined current level is reached in one embodiment or a predetermined time duration is reached in another embodiment. A microprocessor or other electrical measuring circuit measures either the time duration to reach the predetermined current level or the discharge time following current charging for the predetermined time duration. A microprocessor or other electrical logic circuit derives the core position from the measured time to reach the predetermined current level or the measured discharge time following current charging for the predetermined time duration. A switching element interrupts the charging of the coil before the current can reach a peak level, such timing measurement thereby occurring during the approximately linear portion of the inductive current charging curve.

4 Claims, 7 Drawing Figures a)

b)

c)

INDUCTIVE MEASURING ARRANGEMENT FOR DETERMINING THE POSITION OF A MOVABLE CORE MEMBER

BACKGROUND OF THE INVENTION

The invention covers a position determining arrangement having an inductive sensor.

In such sensors, the inductivity of a coil will be changed by moving the position of an iron core. By means of electonics, this change will be measured and converted into a linear motion measurement.

To date, it has been customary to use a coil to determine the frequency of an oscillator circuit as shown in German Patent No. DE-OS 20 46 336. Whenever the inductivity is changed, the oscillator circuit will change. The resulting change in frequency is then analyzed and transformed into a corresponding linear motion signal.

The disadvantage of this solution is the dependence of active oscillator components on temperature, whereby the measured value becomes inaccurate, especially when temperature fluctuations are large. Furthermore, the relationship between frequency and inductivity, or the path traveled by the iron core with $f = \frac{1}{2}\pi \sqrt{L \times C}$ is not linear, whereby a corrective switching may be necessary.

SUMMARY OF THE INVENTION

It is, therefore, an object of the invention to provide a position determining arrangement using an inductive sensor which is independent of active oscillator components which can fluctuate greatly in performance due to temperature variations.

It is a further object of the invention to provide such a position determining arrangement which utilizes the initial, approximately linear, performance characteristic of an inductive charging current.

The invention has the purpose of creating a sensor to suit the above condition but in such a way that the problems described can be avoided. The electronics should also be simple and relatively inexpensive.

Briefly, the invention consists of a voltage generating arrangement which outputs a short duration voltage signal to a coil having an iron core which moves within the coil. The distance the core moves within the coil can be determined by the change in inductance which results from such core penetration. The inductive charging current can then be used to charge a capacitor to a certain voltage. The short duration voltage signal can operate an electronic switch disposed between the coil and the capacitor such that, when the voltage signal ends, the switch opens and the capacitor can be discharged through a resistor capacitor arrangement. This discharge time can be measured to thus determine the inductance and, consequently, the core penetration/distance. The inductive charging current can also determine, with the use of a current limiting arrangement, the inductance and hence core penetration. By measuring the time it takes for the inductive charging current to reach the current limit, the inductance can also be determined.

DESCRIPTION AND OPERATION

Figure 1:
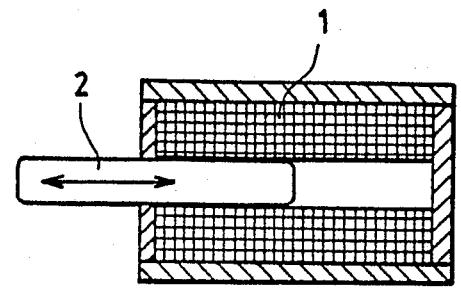
FIG. 1 is a schematic representation of the mechanical portion of the inductor.

As shown in FIG. 1, the schematic depiction of the mechanical sensor portion consists of a coil 1, into which a sliding core of iron can be moved for the path to be measured. The possible stroke of the core 2 amounts to about 2 cm. The component to be measured can also be activated by a lever, to make it possible to measure larger movements.

Figure 2:
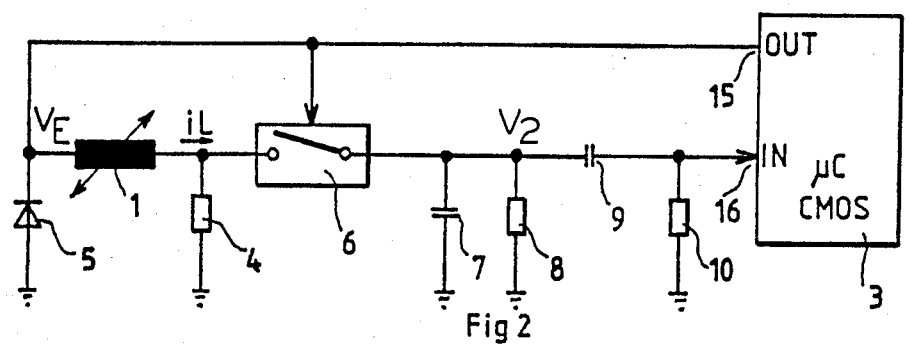
FIG. 2 is a diagrammatical representation of a position determining arrangement constructed according to the invention.

FIG. 2 shows a first embodiment of the position determining arrangement, which is used to measure the change in inductivity of the coil 1. A voltage pulse generating arrangement which in this embodiment is shown as a microprocessor 3, of CMOS design, emits a rectangular impulse at the exit terminal 15 (OUT). The microprocessor 3 can be chosen from a number of such devices which are readily and commercially available. This impulse can have a duration of 10 usec. and an intensity of 5 V. By means of this voltage impulse $V_E$, coil 1 is energized in cooperation with a resistance 4. Diode 5 operates as a free-wheeling diode for coil 1 to clamp against oscillations which may result from stray capacitances. The same voltage impulse $V_E$ will close an electronic switch 6, which can also consist of an FET transistor. A condenser 7 is charged to a voltage $V_2$ by the inductive charging current $i_L$ of coil 1. The charging phase will be terminated as soon as switch 6 opens after termination of voltage impulse $V_E$. If there is high inductivity, there is a low final voltage $V_2$, and if there is a low inductivity, there is a high final voltage $V_2$, the difference resulting from the different time constants $\tau$ of coil 1. Condenser 7 is then discharged by way of a resistor 8. The time constant for discharge will hereby be selected higher than the time constant for charging. The discharge voltage $V_2$ will be transmitted by way of an RC connector 9, 10 to an entry terminal 16 (IN) of microprocessor 3. Microprocessor 3 will measure the discharge time up to a lowering of $V_2$ to a certain voltage threshold. This time is a direct measurement of the inductivity or the travel distance. It should also be noted that although the microprocessor 3 performs the pulse generating clocking, and inductivity calculating functions, such functions can be performed by other, separate electronic logic devices as well. The pulse generating arrangement could be employed in conjunction with a precision chronograph to achieve the desired results.

Figure 3:
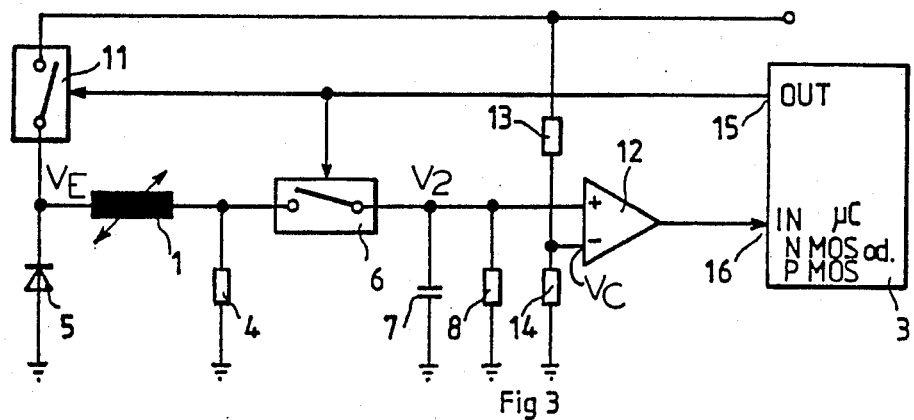
FIG. 3 is a diagrammatical representation of an alternate embodiment of a position determining arrangement constructed according to the invention.

Switching according to FIG. 3 is separated from switching according to FIG. 2, in that a PMOS or NMOS microprocessor without a null detector is used.

Exit terminal 15 (OUT) will emit a rectangular voltage impulse of approximately 5 V. This impulse will close an electronic switch 11, by which the supply voltage $V_B$ will be entered into coil 1. The remaining part of the switching process is identical with that described in FIG. 2. Since the microprocessor 3 does not have a null detector, a comparator 12 has been added. By means of a voltage separator with resistors 13, 14, a threshold voltage $V_C$ will be set. As soon as the condenser voltage $V_2$ drops below this threshold value during the discharging process, the time recording process in the microprocessor 3 will be terminated.

Figure 4:
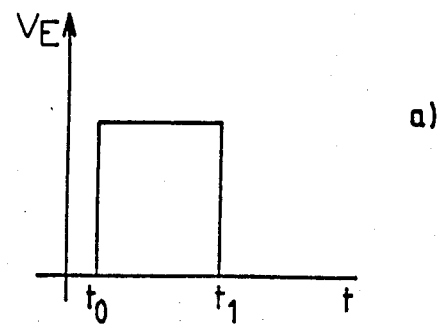
FIG. 4 (a through c) is a graphical representation of voltages and current versus time for the position determining arrangement shown in FIG. 3.
Figure 4:
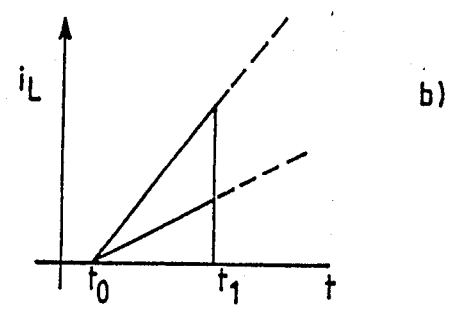
Figure 4:
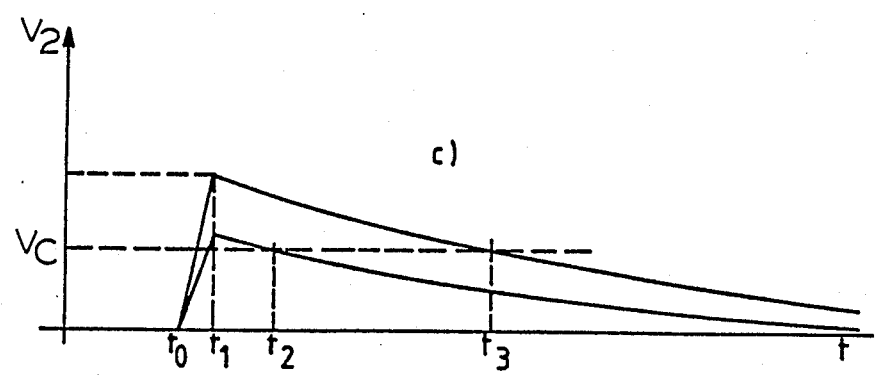

FIG. 4 shows the voltage flow and intensities of the switching process according to FIG. 3.

FIG. 4a shows the voltage impulse $V_E$ which is emitted by microprocessor 3 at terminal 15. This impulse remains from $t_0$ to $t_1$ and will be emitted whenever a measured value is desired.

FIG. 4b shows that voltage impulse $V_E$ of coil 1 produces a current $i_L$ in coil 1 which rises according to an exponential function. This current lasts also from $t_0$ to $t_1$. Voltage impulse $V_E$ is selected so short, that only the first approximately linear portion of load current $i_L$ is utilized. Two separately high currents are shown, with the higher belonging to the smaller inductivity of coil 1.

FIG. 4c shows voltage $V_2$ at condenser 7 based on time. Beginning with time $t_1$, switch 6 will start to open and the discharge of condenser 7 will commence. This discharge takes up more time than does the charging. The discharge time is measured by a timer in microprocessor 3. The measurement is completed as soon as the declining discharge voltage drops below a threshold value $V_C$ determined by the comparator 12. This will occur at a time $t_2$ with large inductivity and at a time $t_3$ with small inductivity, as shown in FIG. 4c, but only the linear portion of the discharge curve will be measured here.

The switching arrangement, according to FIG. 3, makes it possible to briefly activate the electronic switch 6 after the completed measurement, but it will be necessary to keep the second electronic switch 11 open. The purpose of the repeat activation of the switch 6 is the need to discharge condenser 7 completely and rapidly by way of resistor 4. A higher measuring frequency by microprocessor 3 is hereby possible.

The switching arrangements, according to FIGS. 2 and 3, have a minimal amount of component parts for the type of technology. When using a microprocessor with zero voltage indication (FIG. 2), the comparator 12 (FIG. 3) can be dispensed with. The control of the travel path by microprocessor 3 can be done digitally, so that no additional A/D converter is necessary.

The duration of a voltage impulse $V_E$ is constant and is a multiple of one bit.

The evaluating electronics according to FIGS. 2 or 3 (without microprocessor 3) can be integrated directly in the sensor (FIG. 1). For adverse temperature conditions, one may prefer to mount the electronic equipment in a protected location and connect the mechanical part 1, 2 of the sensor by means of a cable.

Figure 5:
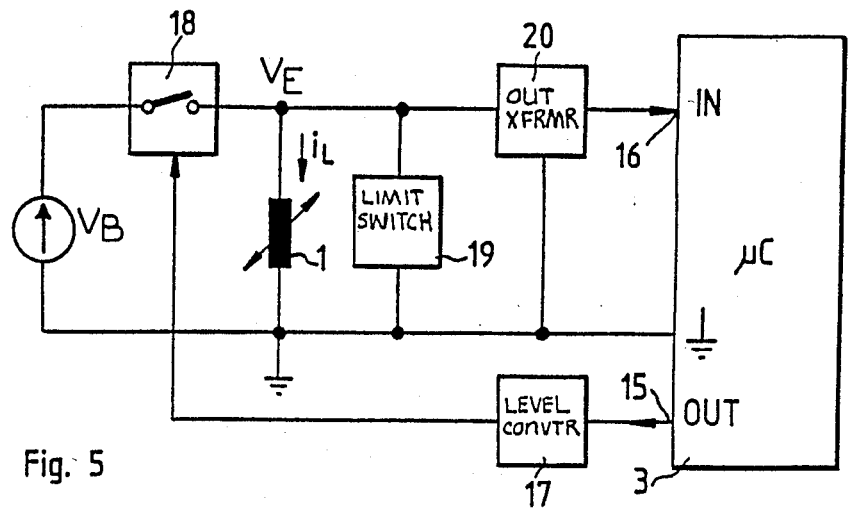
FIG. 5 is a diagrammatical representation of a second alternate embodiment of a position determining arrangement constructed according to the invention.
Figure 6:
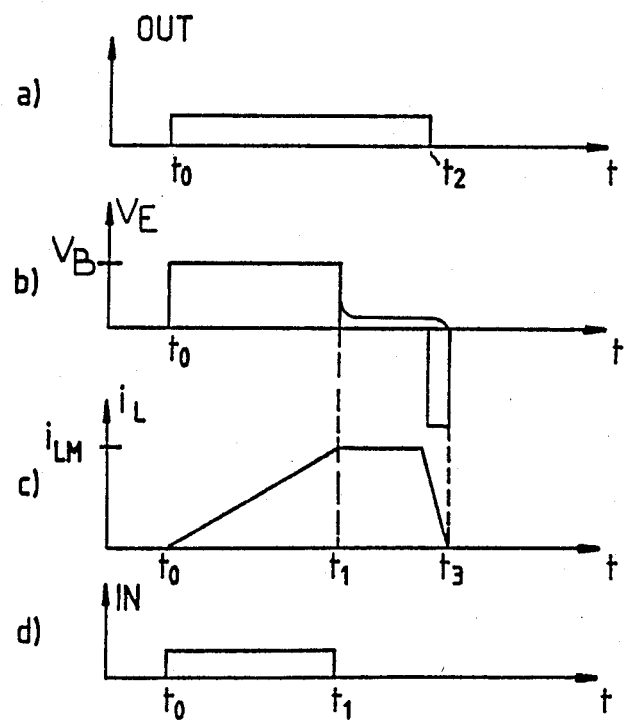
FIG. 6 (a through d) is a graphical representation of voltages and current versus time for the position determining arrangement shown in FIG. 5.

FIG. 5 shows a third embodiment of the position determining arrangement in form of a block switching arrangement. An operating voltage $V_B$ is given into a coil 1 by means of a current limiting electronic switch 18. Switch 18 is activated by way of a level converter 17 from microprocessor 3 (exit 15, OUT). This impulse lasts from time $t_0$ to time $t_2$ (see FIG. 6a). Initially, the following relationship is established: $V_E = V_B$ (FIG. 6b); that is, the voltage $V_E$ across coil 1 will attain the voltage level $V_B$ at time $t_0$ due to the closing of switch 18, however, voltage $V_E$ will collapse thereafter at time $t_1$ which is prior to the opening of switch 18 and removal of voltage $V_B$.

As soon as the inductive charging current $i_L$ has reached a predetermined value, e.g. 45 mA, this current is limited or held by switch 18. During this time ($t_1-t_2$), the voltage drop at coil 1 will be determined by the ohm resistance, but it will be very small. The coil current is then disconnected from $t_2-t_3$. Time $t_2$ is thereby determined by microprocessor 3. The incurred voltage will be limited to a safe value, e.g. 45 V, by means of a limiting switch 19. The voltage decrease $V_E$ at time $t_1$ is then transmitted to the microprocessor 3 after a level transformation in exit transformer 20. The microprocessor 3 will terminate the time measurement and retains the measured result $t_1-t_0$ which is proportional to the coil inductivity for further processing.

To terminate the measuring process, and to prepare the next measuring process, the microprocessor 3 will switch off the OUT signal, thus terminating $V_E$ and $i_L$. The shut-off energy of coil 1 will be absorbed rapidly by limiter 19 and without undesirable voltage peak.

Figure 7:
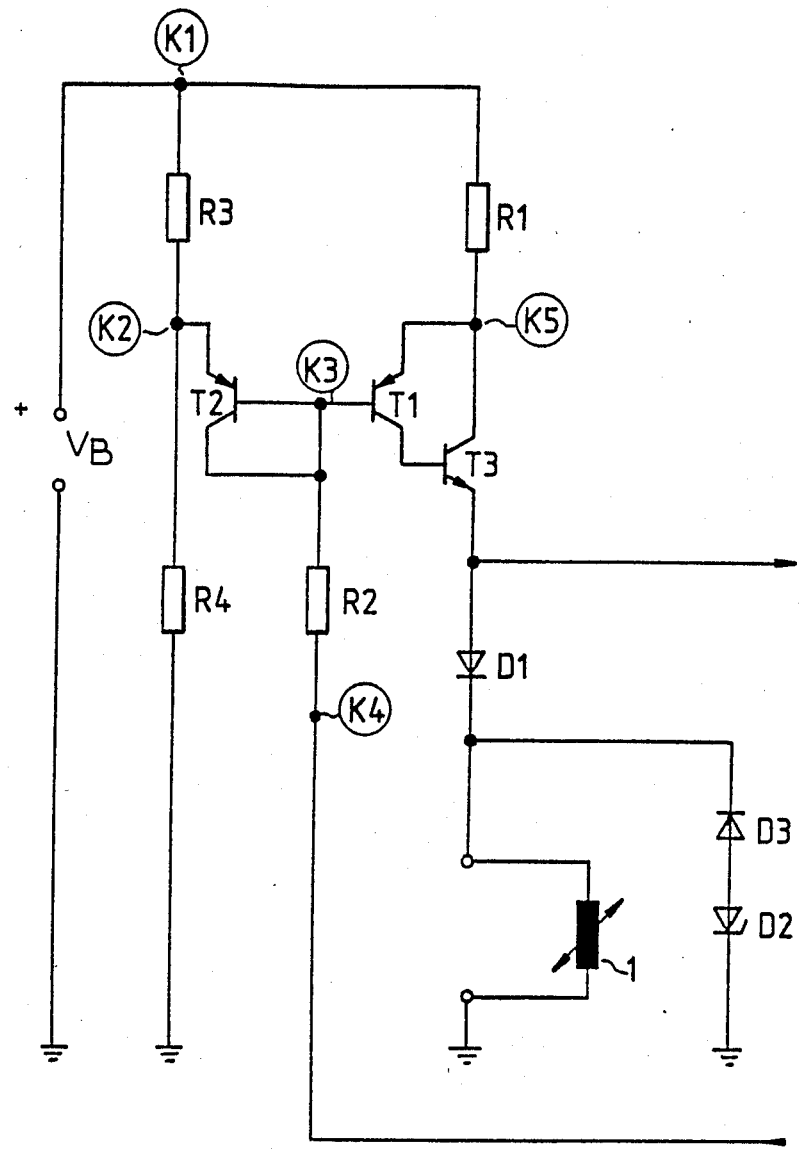
FIG. 7 is a schematic representation of the current limiting arrangement shown diagrammatically in FIG. 5.

FIG. 7 shows the left part of the switching arrangement, according to FIG. 5, with current limiting electronic switch 18 of coil 1 and limiting switch 19.

Current limiter 18 consists of a control voltage source portion (T2, R2, R3, R4) and a voltage controlled current source portion (T1, T3, R1, D1).

The current source proportions the switching nodes K3 and K1 of the control voltage source and converts them into an exit current $i_L$. The control transistor T1 will follow up on the control voltage output with an adjustment of the voltage to the R1 value of the control voltage output. Transistor T3 acts hereby as a current amplifier. The diode D1 provides a protection against overloads.

The control voltage source derives the comparison voltage $V_{K2-K1}$ from the supply voltage $V_B$. From the latter, the above control voltage $V_{K3-K1}$ will be derived. The following three conditions will occur:

(a) Switched off: The exit OUT of microprocessor 3 has the value 0 and places the K4 node by means of level transformer 17 to potential K1. Transistor T2 will then block node K3 against K2. The control voltage is hereby at zero. Transsistors T1 and T3 are thus blocked.

(b) Floating: The exit OUT has the value 1 and connects node K4 over entry level transformer 17 to the mass potential. A small current will thus be transmitted over R1, T1 (emitter basis length) and R2, which will open transistors T1 and T3 completely. Because of the self-inductivity of coil 1 (see ill. 6), current $i_L$ and thus voltage $V_{K5-K1}$ will rise from zero and voltage $V_{K3-K1}$ will rise ramp-like from about 0.6 V, whereas T2 remains closed, because it is precharged by voltage $V_{K2-K1}$. In this condition, the potential will "float" at node K3 with that of K5.

(c) Limited: The exit OUT continues to retain the value 1. After moving through condition (b), $i_L$ has grown to a point, whereby the precharging at T2 is insufficient for blocking. Because T2 is now conducting, the outflowing current from K3 over R2 to K4 is no longer supplied by T1 alone. This means that T1 and T3 cannot be completely controlled, but only in as far as voltage $V_{K5-K1}$ will be as large as the comparative voltage $V_{K2-K1}$. Coil current $i_L$ will thereby be limited to $i_{LM} = 1/R1 \times V_{K1-K2}$. Transistors T1 and T2 are thermally coupled, so that a temperature compensation of basis emitter voltages are changed from T1 to T2. The value $i_{LM}$ is also temperature resistant.

The shut-off limiter 19 is formed by diodes D3 and D2. D3 will keep the positive voltage, which develops at the coil and at the shut-off limiter during the current increase, away from the Zener diode D2.

When the high negative shut-off voltage occurs, which results from the collapse of the coil field, D3 will become conducting. The Zener diode D2 can now be activated. The shut-off voltage peak is now limited to the sum of the Zener voltage (D2) and the forward voltage (D3).

The limiting voltage will influence the discharge rate of the coil current $i_L$. Because the limiting voltage is four times the supply voltage $V_B$ used for the charging process, the voltage discharge is four times as fast. The system is thus ready for a new measuring procedure in a very short time.

The switching system, according to FIGS. 5 or 7, has the advantage of the simpler system of measurement, as compared to those of FIGS. 2 and 3. The possible measuring rate is also larger. Switching systems according to FIGS. 2 and 3, on the other hand, have a higher measuring precision.

We claim:

1. An inductance measuring arrangement comprising:
   (a) an inductive coil;
   (b) a movable core member variably positionable within said inductive coil such that, the electrical characteristics of said inductive coil vary according to such position of said movable core member;
   (c) a voltage source coupled at times, to said inductive coil such that a voltage of predetermined amplitude is imposed on said inductive coil, and thereby develops a charging current thereacross as a function of such electrical characteristics when such position of said movable core member is to be determined, such charging current being selectable in value to at least one of a predetermined charging current level and a predetermined charging current time duration;
   (d) evaluating means coupled to said inductive coil for evaluating such charging current developed therethrough and deriving such position of said movable core member therefrom;
   (e) current-limiting means coupled between said voltage source and said inductive coil for limiting such charging current to a predetermined peak value, said evaluating means evaluating the time duration to reach such predetermined peak value and thereby deriving the position of said movable core member therefrom; and
   (f) said current-limiting means having a control voltage portion and a current source portion, said current source portion having a first transistor being biased upon initiation of an enabling signal from said evaluating means such that such charging current can flow thereover to said inductive coil, said first transistor being disabled upon removal of such enabling signal to thereby block the flow of such charging current to said inductive coil such that said inductive coil then discharges, said control voltage portion having a second transistor with a second base lead connected to a first base lead of said first transistor such that such enabling signal is received at said base leads by said first and second transistors simultaneously, said second transistor further having a collector lead connected to said second base lead thereby establishing a blocking condition of said second transistor which prevents said second transistor from turning on until such charging current exceeds a first predetermined value lesser in magnitude than said predetermined peak value, said second transistor being turned on establishing a control voltage value across a control resistor connected between said voltage source and an emitter lead of said second transistor, such control voltage value being applied to a first resistor associated with said current limiting portion to establish such predetermined peak value for such charging circuit.

2. An inductance measuring arrangement, as set forth in claim 1, wherein said first and second transistors are PNP transistors.

3. An inductance measuring arrangement as set forth in claim 2, wherein said current source portion of said current limiting means further includes a third transistor having a third base connection coupled to a second collector terminal of said second transistor and a third emitter connection coupled to said inductive coil.

4. A position determining arrangement, as set forth in claim 1, wherein said evaluating means is a logic operation performed by a microprocessor.

* * * * *